(12) United States Patent
Welch

(10) Patent No.: US 10,763,807 B2
(45) Date of Patent: Sep. 1, 2020

(54) METHOD AND SYSTEM FOR A FEEDBACK TRANSIMPEDENCE AMPLIFIER WITH SUB-40KHZ LOW-FREQUENCY CUTOFF

(71) Applicant: Luxtera, Inc., Carlsbad, CA (US)

(72) Inventor: Brian Welch, San Diego, CA (US)

(73) Assignee: LUXTERA LLC, Wilmington, DE (US)

( * ) Notice: Subject to any disclaimer, the term of this patent is extended or adjusted under 35 U.S.C. 154(b) by 0 days.

(21) Appl. No.: 16/372,164

(22) Filed: Apr. 1, 2019

(65) Prior Publication Data

US 2019/0229689 A1 Jul. 25, 2019

Related U.S. Application Data

(63) Continuation of application No. 15/251,955, filed on Aug. 30, 2016, now Pat. No. 10,250,207, which is a continuation of application No. 14/305,733, filed on Jun. 16, 2014, now Pat. No. 9,431,977, which is a continuation of application No. 13/926,851, filed on
(Continued)

(51) Int. Cl.
  *H03F 3/45* (2006.01)
  *G01J 1/44* (2006.01)
  *H03F 1/34* (2006.01)
  *H03F 3/08* (2006.01)

(52) U.S. Cl.
  CPC ............ *H03F 3/45237* (2013.01); *G01J 1/44* (2013.01); *H03F 1/34* (2013.01); *H03F 3/087* (2013.01); *H03F 3/45071* (2013.01); *H03F 3/45076* (2013.01); *H03F 3/45475* (2013.01); *H03F 3/45968* (2013.01); *H03F 2200/405* (2013.01); *H03F 2203/45222* (2013.01);
(Continued)

(58) Field of Classification Search
  CPC ............ H03F 3/45237; H03F 3/45076; H03F 3/45071; H03F 3/45968; H03F 3/45475; H03F 3/087; H03F 1/34; H03F 2203/45288; H03F 2203/45222; H03F 2203/45526; H03F 2203/45511; H03F 2200/405; G01J 1/44
  USPC .................................................... 250/214 A
  See application file for complete search history.

(56) References Cited

U.S. PATENT DOCUMENTS

| | | | | |
|---|---|---|---|---|
| 6,952,004 B2 * | 10/2005 | Henderson | ........... | H04N 5/3653 250/208.1 |
| 7,652,531 B2 * | 1/2010 | Wang | ........... | H03F 1/08 330/100 |
| 10,250,207 B2 * | 4/2019 | Welch | ........... | H03F 1/34 |

* cited by examiner

Primary Examiner — Seung C Sohn
(74) Attorney, Agent, or Firm — Patterson + Sheridan, LLP

(57) ABSTRACT

A system for a differential trans-impedance amplifier circuit comprising: an amplifier having a pair of input nodes and configured to generate an amplified replica of a differential voltage on said pair of input nodes; a photodiode; a pair of capacitors coupling said photodiode to said pair of input nodes; at least one resistance coupled between said pair of input nodes of said amplifier; and a bias network comprising two photodiode biasing resistances each photodiode biasing resistance coupled in series between said photodiode and a respective DC voltage. A feedback loop for the amplifier may include source followers that are operable to level shift voltages prior to coupling capacitors that couple said photodiode to said amplifier to ensure stable bias conditions for said amplifier. The source followers may include CMOS transistors. The amplifier may be integrated in a complementary metal-oxide semiconductor (CMOS) chip, which may include a CMOS photonics chip.

22 Claims, 5 Drawing Sheets

Related U.S. Application Data

Jun. 25, 2013, now Pat. No. 8,754,711, which is a continuation of application No. 13/175,545, filed on Jul. 1, 2011, now Pat. No. 8,471,639.

(60) Provisional application No. 61/398,987, filed on Jul. 6, 2010.

(52) U.S. Cl.
CPC .............. *H03F 2203/45288* (2013.01); *H03F 2203/45511* (2013.01); *H03F 2203/45526* (2013.01)

METHOD AND SYSTEM FOR A FEEDBACK TRANSIMPEDENCE AMPLIFIER WITH SUB-40KHZ LOW-FREQUENCY CUTOFF

CROSS-REFERENCE TO RELATED APPLICATIONS/INCORPORATION BY REFERENCE

This application is a continuation of application Ser. No. 15/251,955 filed on Aug. 30, 2016, which is a continuation of application Ser. No. 14/305,733 filed on Jun. 16, 2014, which is a continuation of application Ser. No. 13/926,851 filed on Jun. 25, 2013, now U.S. Pat. No. 8,754,711, which is a continuation of Ser. No. 13/175,545 filed on Jul. 1, 2011, now U.S. Pat. No. 8,471,639, which makes reference to, claims priority to and claims the benefit of U.S. Provisional Patent Application No. 61/398,987 filed on Jul. 2, 2010. Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal processing. More specifically, certain embodiments of the invention relate to a method and system for a feedback transimpedance amplifier with sub-40 khz low-frequency cutoff.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Optical communication systems have been widely adopted for applications ranging from internet backbone, local area networks, data centers, supercomputing, to high-definition video. Due to superior bandwidth and low loss, optical fibers are the medium of choice for transporting high-speed binary data.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a feedback transimpedance amplifier with sub-40 khz low-frequency cutoff, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a system for a feedback transimpedance amplifier with sub-40 khz low-frequency cutoff. Exemplary aspects of the invention may comprise amplifying electrical signals received via coupling capacitors utilizing a transimpedance amplifier (TIA) having feedback paths comprising source followers and feedback resistors. The feedback paths may be coupled prior to the coupling capacitors at inputs of the TIA. Voltages may be level shifted prior to the coupling capacitors to ensure stable bias conditions for the TIA. The transimpedance amplifier may be integrated in a CMOS chip and the source followers may comprise CMOS transistors. The TIA may receive current-mode logic or voltage signals. The electrical signals may be received from a photodetector, which may comprise a silicon germanium photodiode and may be differentially coupled to the transimpedance amplifier. The chip may comprise a CMOS photonics chip where optical signals for the photodetector in the CMOS photonics chip may be received via one or more optical fibers.

Figure 1A:
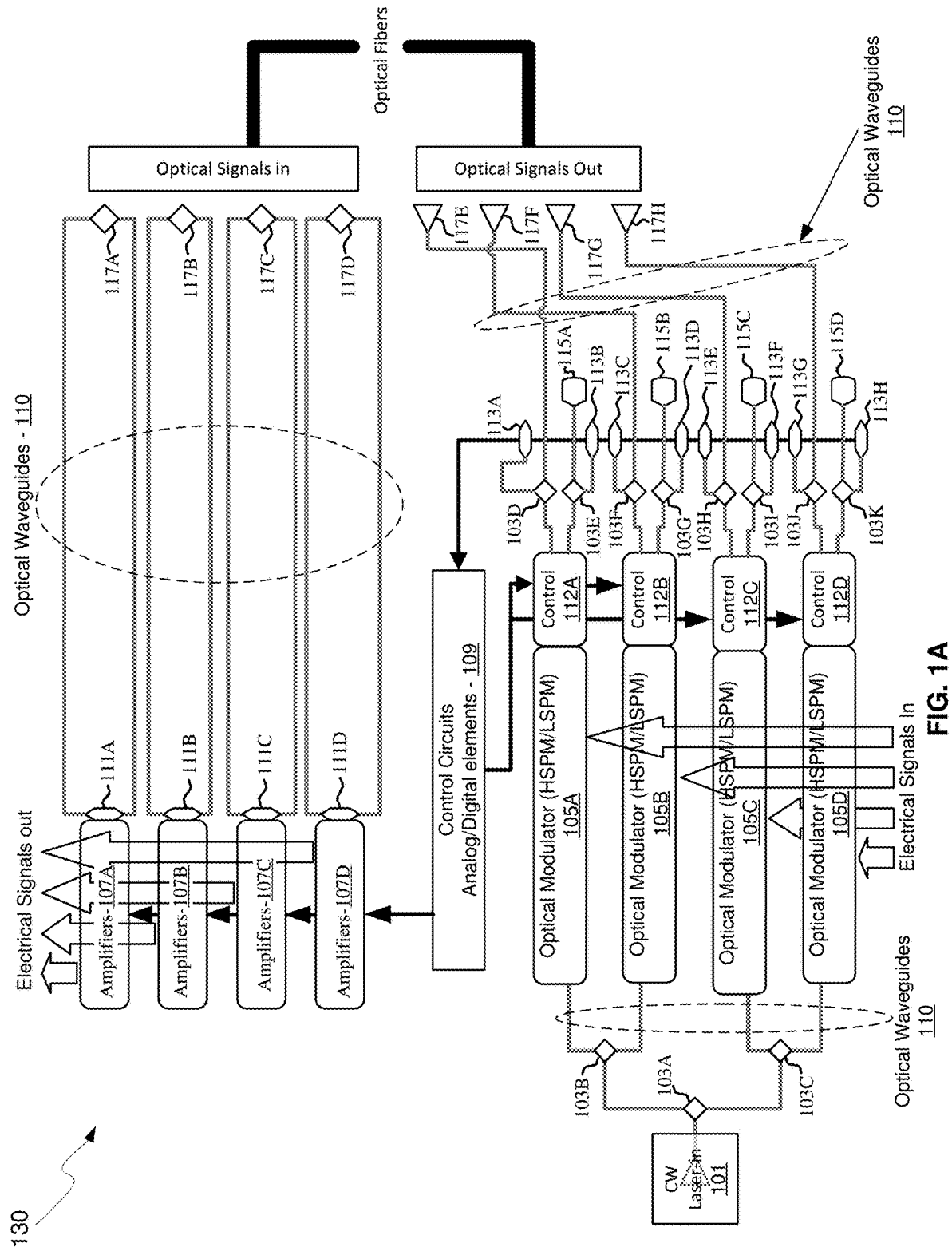
FIG. 1A is a block diagram of a photonically enabled CMOS chip comprising a feedback transimpedance amplifier with sub-40 khz low-frequency cutoff, in accordance with an embodiment of the invention.

FIG. 1A is a block diagram of a photonically enabled CMOS chip comprising a feedback transimpedance amplifier with sub-40 khz low-frequency cutoff, in accordance with an embodiment of the invention. Referring to FIG. 1A, there is shown optoelectronic devices on a CMOS chip 130 comprising optical modulators 105A-105D, photodiodes 111A-111D, monitor photodiodes 113A-113H, and optical devices comprising taps 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

Optical signals are communicated between optical and optoelectronic devices via optical waveguides 110 fabricated in the CMOS chip 130. Single-mode or multi-mode waveguides may be used in photonic integrated circuits.

Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode whose polarization is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab.

The optical modulators 105A-105D comprise Mach-Zehnder or ring modulators, for example, and enable the modulation of the continuous-wave (CW) laser input signal. The optical modulators 105A-105D comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

The phase modulators may have a dual role: to compensate for the passive biasing of the MZI and to apply the additional phase modulation used to modulate the light intensity at the output port of the MZI according to a data stream. The former phase tuning and the latter phase modulation may be applied by separate, specialized devices, since the former is a low speed, slowly varying contribution, while the latter is typically a high speed signal. These devices are then respectively referred to as the LSPM and the HSPM. Examples for LSPM are thermal phase modulators (TPM), where a waveguide portion is locally heated up to modify the index of refraction of its constituting materials, or forward biased PIN junction phase modulators (PINPM) where current injection into the PIN junction modifies the carrier density, and thus the index of refraction of the semiconductor material. An example of an HSPM is a reversed biased PIN junction, where the index of refraction is also modulated via the carrier density, but which allows much faster operation, albeit at a lower phase modulation efficiency per waveguide length.

The outputs of the modulators 105A-105D may be optically coupled via the waveguides 110 to the grating couplers 117E-117H. The taps 103D-103K comprise four-port optical couplers, for example, and are utilized to sample the optical signals generated by the optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D may be utilized to couple light received from optical fibers into the CMOS chip 130, and the grating couplers 117E-117H may be utilized to couple light from the CMOS chip 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip 130, and may be aligned at an angle from normal to the surface of the CMOS chip 130 to optimize coupling efficiency. In an embodiment of the invention, the optical fibers may comprise single-mode fiber (SMF) and/or polarization-maintaining fiber (PMF).

In another exemplary embodiment, optical signals may be communicated directly into the surface of the CMOS chip 130 without optical fibers by directing a light source on an optical coupling device in the chip, such as the light source interface 135 and/or the optical fiber interface 139. This may be accomplished with directed laser sources and/or optical sources on another chip flip-chip bonded to the CMOS chip 130.

The photodiodes 111A-111D may convert optical signals received from the grating couplers 117A-117D into electrical signals that are communicated to the amplifiers 107A-107D for processing. In another embodiment of the invention, the photodiodes 111A-111D may comprise high-speed heterojunction phototransistors, for example, and may comprise germanium (Ge) in the collector and base regions for absorption in the 1.3-1.6 µm optical wavelength range, and may be integrated on a CMOS silicon-on-insulator (SOI) wafer.

The analog and digital control circuits 109 may control gain levels or other parameters in the operation of the amplifiers 107A-107D, which may then communicate electrical signals off the CMOS chip 130. The control sections 112A-112D comprise electronic circuitry that enable modulation of the CW laser signal received from the splitters 103A-103C. The optical modulators 105A-105D may require high-speed electrical signals to modulate the refractive index in respective branches of a Mach-Zehnder interferometer (MZI), for example. In an embodiment of the invention, the control sections 112A-112D may include sink and/or source driver electronics that may enable a bidirectional link utilizing a single laser.

In operation, the CMOS chip 130 may be operable to transmit and/or receive and process optical signals. Optical signals may be received from optical fibers and converted to electrical signals by the photodetectors 111A-111D. The electrical signals may be amplified by transimpedance amplifiers in the amplifiers 107A-107D, for example, and subsequently communicated to other electronic circuitry, not shown, in the CMOS chip 130. High impedance feedback in the transimpedance amplifiers may enable optical sensitivity for low signal levels. Furthermore, the low impedance feedback may comprise feedback resistors that bias the transimpedance front end, shifting the low-frequency cutoff to higher frequencies.

In an embodiment of the invention, source follower circuits may be implemented in the transimpedance feedback path to mitigate the low-frequency cutoff shift from low impedance feedback. This may eliminate the low frequency cutoff, and the source followers may be operable to shift to ensure consistent bias points across the amplification stage.

Integrated photonics platforms allow the full functionality of an optical transceiver to be integrated on a single chip, the CMOS chip 130, for example. A transceiver chip comprises opto-electronic circuits that create and process the optical/electrical signals on the transmitter (Tx) and the receiver (Rx) sides, as well as optical interfaces that couple the optical signal to and from one or more fiber. The signal processing functionality may comprise modulating the optical carrier, detecting the optical signal, splitting or combining data streams, and multiplexing or demultiplexing data on carriers with different wavelengths.

The light source may be external to the chip or may be integrated with the chip in a hybrid scheme. It is often advantageous to have an external continuous-wave (CW) light source, because this architecture allows heat sinking and temperature control of the source separately from the transceiver chip 130. An external light source may also be connected to the transceiver chip 130 via a fiber interface.

An integrated transceiver may comprise at least three optical interfaces, including a transmitter input port to interface to the CW light source, labeled as CW Laser In 101; a transmitter output port to interface to the fiber carrying the optical signal, labeled Optical Signals Out; and a receiver input port to interface to the fiber carrying the optical signal, labeled Optical Signals In.

Waveguide photodetectors may be incorporated in integrated optics platforms, where several components are integrated together on a single receiver chip, as illustrated in FIG. 1A. In this platform, light couplers, such as the optical couplers 117A-117D, couple the optical signal from the fiber into optical waveguides 110. The optical signal subsequently enters the waveguide detectors 111A-111D, where it is converted to an electrical signal. In some embodiments, the coupler may comprise a grating coupler, in which case the fiber is oriented in a near normal configuration to the chip 130 surface.

Figure 1B:
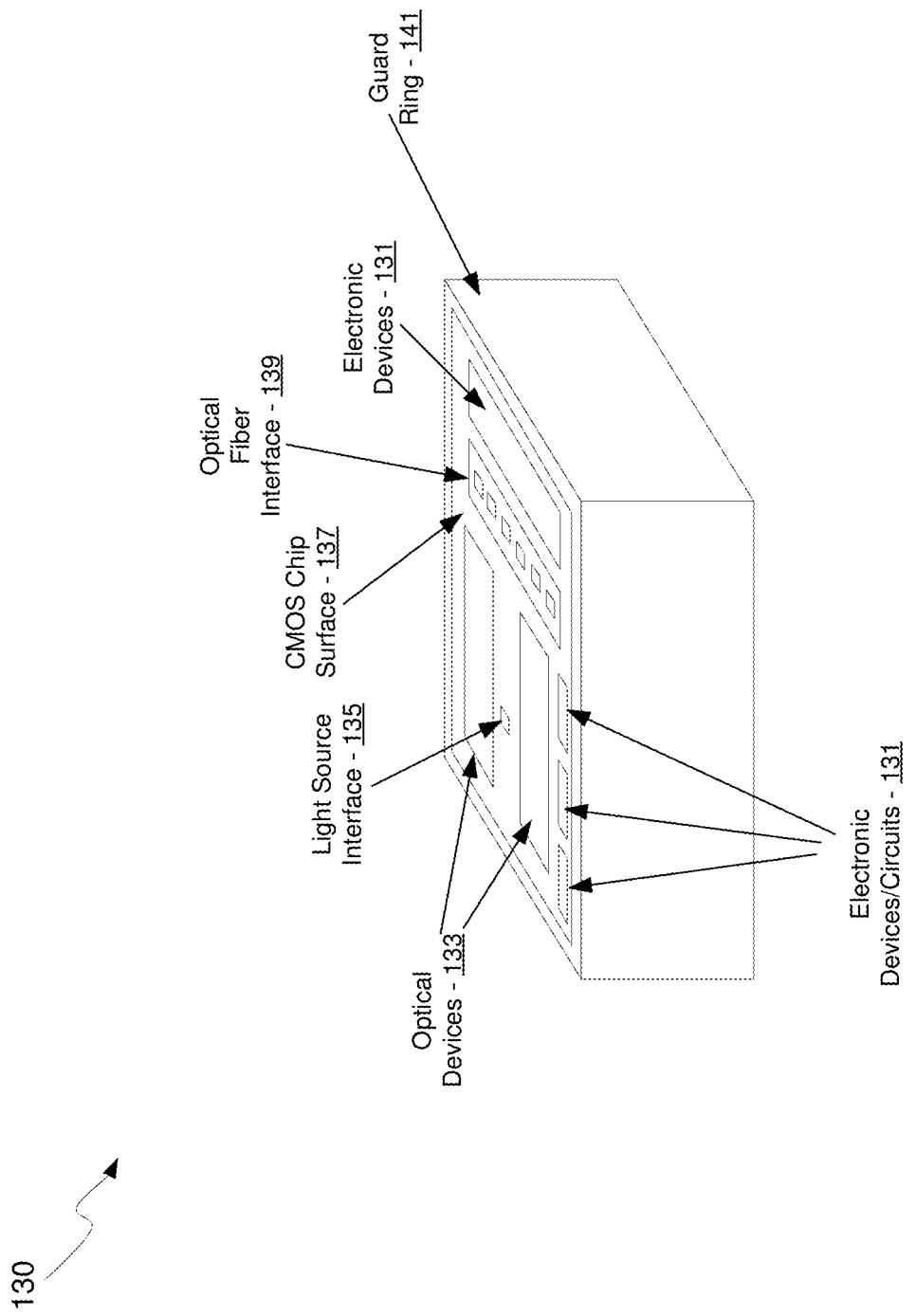
FIG. 1B is a diagram illustrating an exemplary CMOS chip, in accordance with an embodiment of the invention.

FIG. 1B is a diagram illustrating an exemplary CMOS chip, in accordance with an embodiment of the invention. Referring to FIG. 1B, there is shown the CMOS chip 130 comprising electronic devices/circuits 131, optical and optoelectronic devices 133, a light source interface 135, CMOS chip front surface 137, an optical fiber interface 139, and CMOS guard ring 141.

The light source interface 135 and the optical fiber interface 139 comprise grating couplers, for example, that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, optical modulators 105A-105D, high-speed heterojunction photodiodes 111A-111D, and monitor photodiodes 113A-113H.

In an embodiment of the invention, source follower circuits may be implemented in the feedback path of transimpedance amplifiers in the electronic devices/circuits 131 to mitigate the low-frequency cutoff shift from low impedance feedback. This may significantly reduce the low frequency cutoff, and the source followers may be operable to shift voltages to ensure consistent bias points across the amplification stage.

Figure 1C:
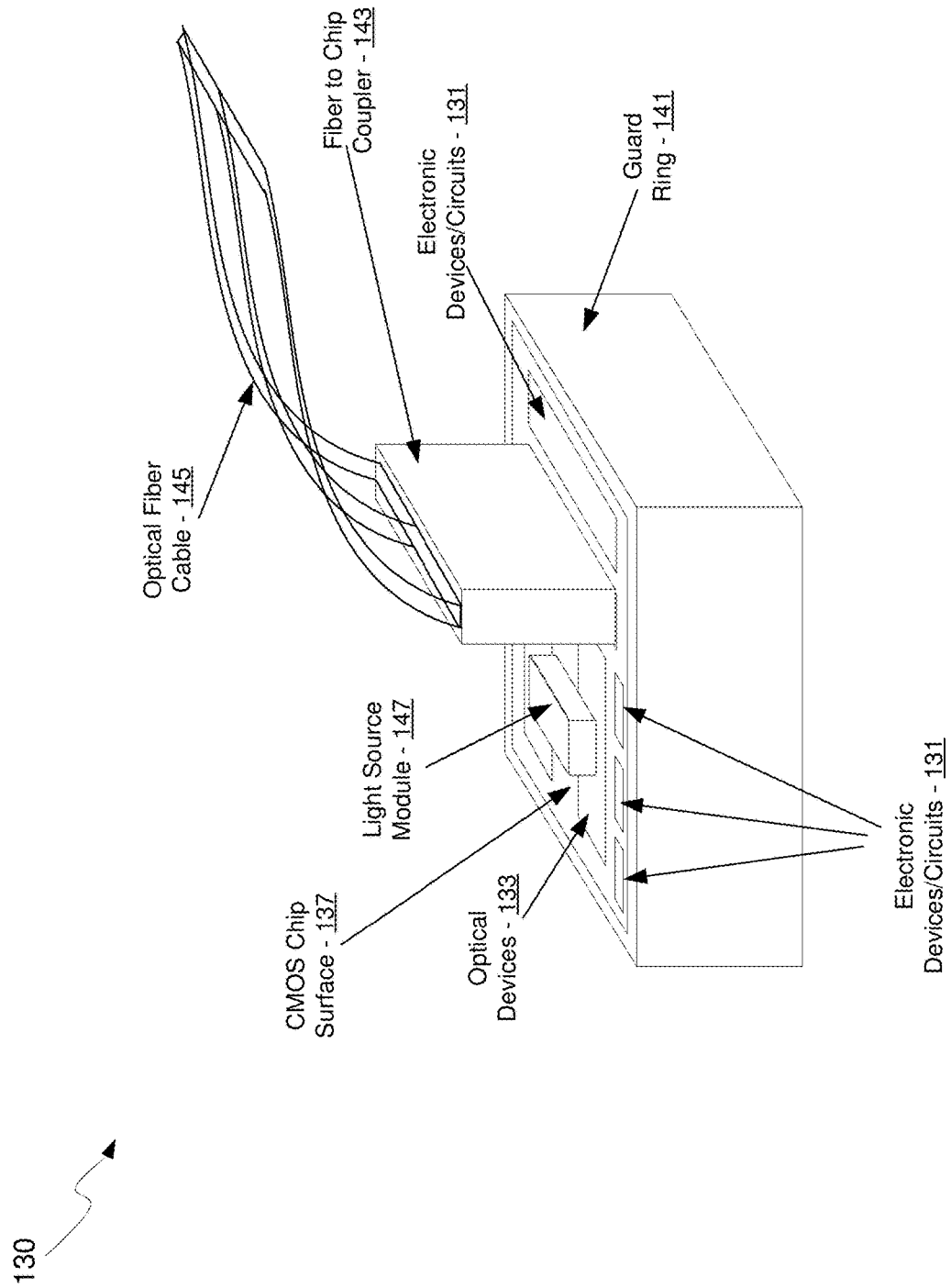
FIG. 1C is a diagram illustrating an exemplary CMOS chip coupled to an optical fiber cable, in accordance with an embodiment of the invention.

FIG. 1C is a diagram illustrating an exemplary CMOS chip coupled to an optical fiber cable, in accordance with an embodiment of the invention. Referring to FIG. 1C, there is shown the CMOS chip 130 comprising the CMOS chip surface 137, and the CMOS guard ring 141. There is also shown a fiber-to-chip coupler 143, an optical fiber cable 145, and an optical source assembly 147.

The CMOS chip 130 comprising the electronic devices/circuits 131, the optical and optoelectronic devices 133, the light source interface 135, the CMOS chip surface 137, and the CMOS guard ring 141 may be as described with respect to FIG. 1B.

In an embodiment of the invention, the optical fiber cable may be affixed, via epoxy for example, to the CMOS chip surface 137. The fiber chip coupler 143 enables the physical coupling of the optical fiber cable 145 to the CMOS chip 130.

In an embodiment of the invention, source follower circuits may be implemented in a feedback path of transimpedance amplifiers in the electronic devices/circuits 131 to mitigate the low-frequency cutoff shift from low impedance feedback. This may significantly reduce the low frequency cutoff, and the source followers may be operable to shift voltages to ensure consistent bias points across the amplification stage.

Figure 2:
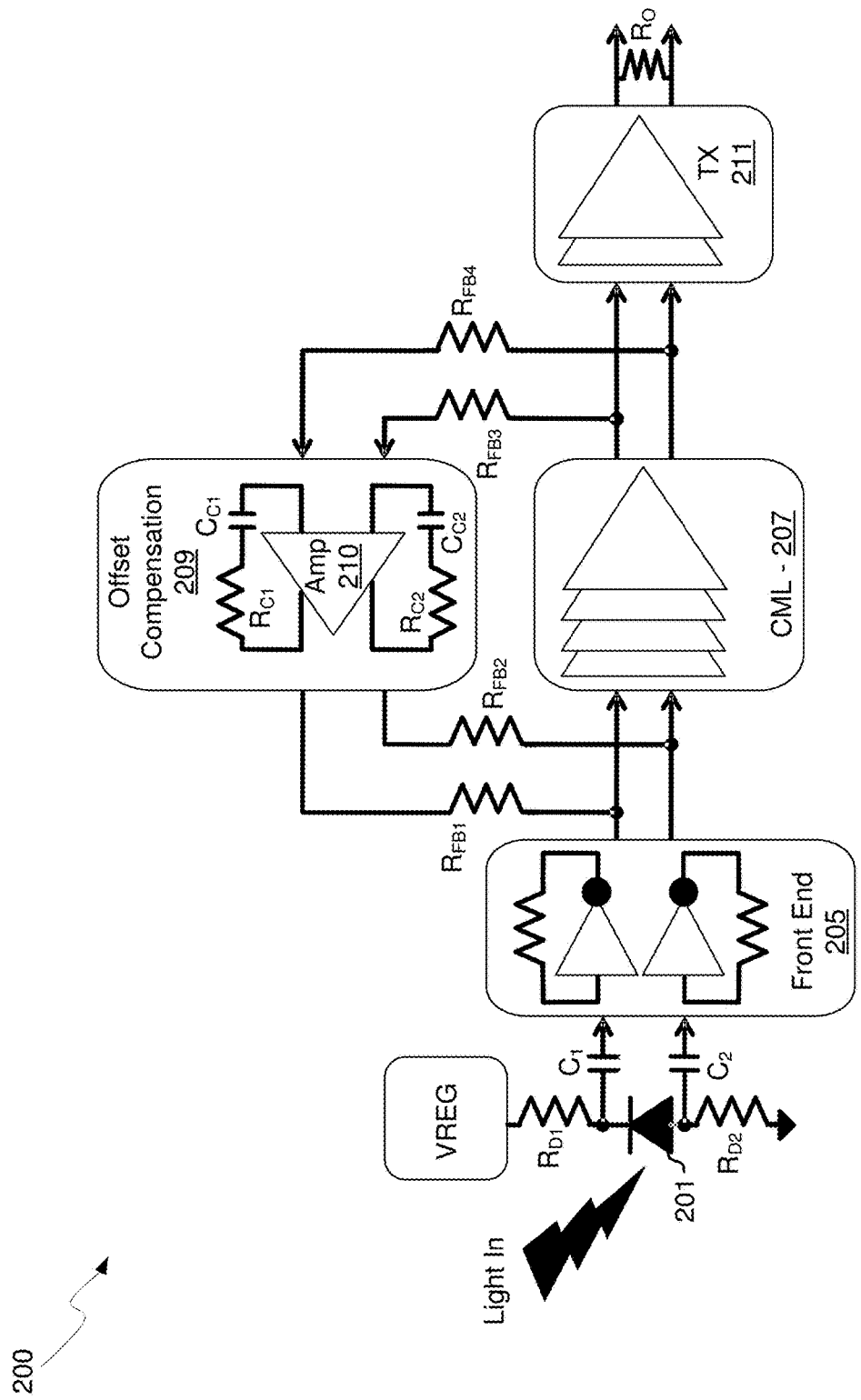
FIG. 2 is a block diagram of an exemplary transimpedance amplifier, in accordance with an embodiment of the invention.

FIG. 2 is a block diagram of an exemplary transimpedance amplifier, in accordance with an embodiment of the invention. Referring to FIG. 2, there is shown a transimpedance amplifier 200 comprising a photodetector 201, detector bias resistors $R_{D1}$ and $R_{D2}$, coupling capacitors $C_1$ and $C_2$, feedback resistors $R_{FB1}$-$R_{FB4}$, a high impedance front end 205, current mode logic (CML) stage 207, an offset compensation block 209, a transmit (Tx) block 211, and an output resistance $R_o$.

The photodetector 201 may comprise a semiconductor diode, for example, operable to convert received optical signals into electrical signals. The photodetector 201 may comprise a germanium/silicon-germanium diode integrated in the CMOS chip 130, for example. The bias resistors $R_{D1}$ and $R_{D2}$ may provide proper biasing conditions for the photodetector 201. The high impedance front end 205 may comprise inverters with resistive feedback and may provide amplification for the electrical signals received from the photodetector 201 via the coupling capacitors $C_1$ and $C_2$.

The offset compensation block 209 may be integrated in the high impedance feedback path for the transimpedance amplifier 200, and may improve performance by mitigating device impedance variation. The offset compensation 209 may comprise a differential amplifier 210 with RC feedback elements $R_{C1}$, $C_{C1}$, $R_{C2}$, and $C_{C2}$ which may enable mitigation of offset DC voltages between the signals at the inputs to the CML stage 207.

The Tx block 211 may comprise one or more gain stages that may be operable to amplify signals received from the CML stage 207 for communication to other electronic circuits in the CMOS chip 130.

In operation, optical signals may be received by the photodetector 201 and converted to electrical signals that may be AC-coupled to the high impedance front end 205 via the coupling capacitors $C_1$ and $C_2$. The AC-coupled electrical signals may then be amplified by the high impedance front end 205 before being communicated to the CML stage 207. The high impedance feedback loop, comprising the feedback resistors $R_{FB1}$-$R_{FB4}$ and the offset compensation block 209, may enable low sensitivity for the transimpedance amplifier 200, and the resistors may bias the high impedance front end 205.

Furthermore, since the feedback resistors $R_{FB1}$-$R_{FB4}$ are between the coupling capacitors and the CML stage 207 in this configuration, the low-frequency cutoff may be high. This may be mitigated by coupling the feedback resistors prior to the coupling capacitors $C_1$ and $C_2$, which is enabled by incorporating source followers in the feedback path, due to their level-shifting capability.

Figure 3:
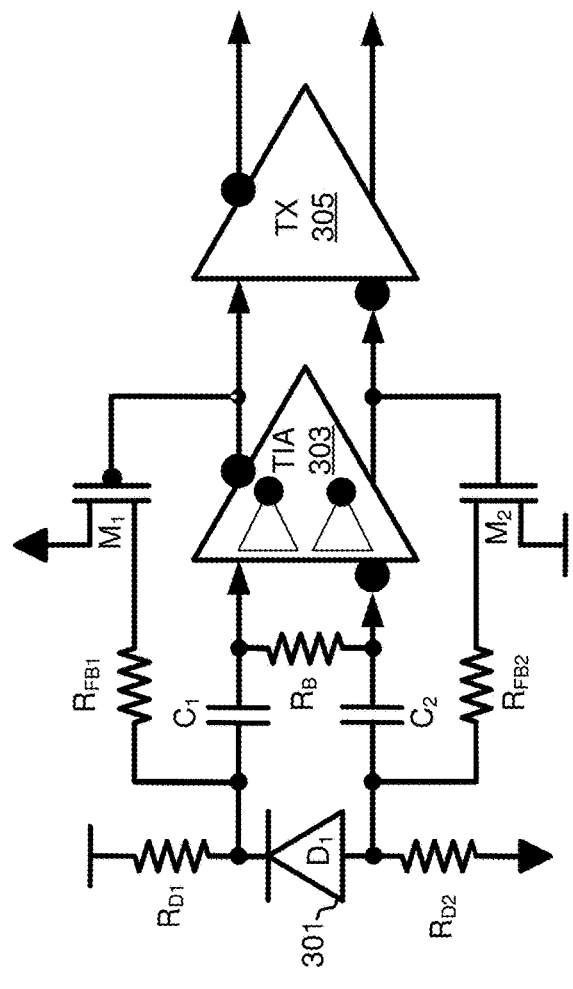
FIG. 3 is a block diagram of an exemplary transimpedance amplifier with low-frequency cutoff mitigation, in accordance with an embodiment of the invention.

FIG. 3 is a block diagram of an exemplary transimpedance amplifier circuit with low-frequency cutoff mitigation, in accordance with an embodiment of the invention. Referring to FIG. 3, there is shown a transimpedance amplifier circuit 300 comprising a photodetector 301, detector bias resistors $R_{D1}$ and $R_{D2}$, coupling capacitors $C_1$ and $C_2$, feedback resistors $R_{FB1}$ and $R_{FB2}$, a bias resistor $R_B$, a transimpedance amplifier 303, feedback source followers $M_1$ and $M_2$, and a transmit Tx block 305.

The photodetector 301, detector bias resistors $R_{D1}$ and $R_{D2}$, coupling capacitors $C_1$ and $C_2$, and the feedback resistors $R_{FB1}$ and $R_{FB2}$ may be substantially similar to the photodetector 201, detector bias resistors $R_{D1}$ and $R_{D2}$, coupling capacitors $C_1$ and $C_2$, and the feedback resistors $R_{FB1}$ and $R_{FB2}$ described with respect to FIG. 2. In an exemplary embodiment of the invention the feedback resistors $R_{FB1}$ and $R_{FB2}$ may have resistance values of approximately 7 kΩ and the bias resistor $R_B$ may have a resistance value of approximately 2.5 MΩ.

The transimpedance amplifier 303 may be operable to receive a differential current signal and generate an amplified output voltage signal that may be communicated to the Tx block 305. The transimpedance amplifier 303 may comprise a high impedance feedback path comprising the source followers $M_1$ and $M_2$ and the feedback resistors $R_{FB1}$ and $R_{FB2}$. The source followers $M_1$ and $M_2$ may comprise CMOS transistors, for example.

In operation, optical signals may be received by the photodetector 301 and converted to electrical signals that may be AC-coupled to the transimpedance amplifier 303 via the coupling capacitors $C_1$ and $C_2$. The AC-coupled electrical signals may then be amplified by the transimpedance amplifier 303 before being communicated to the Tx block 305. The high impedance feedback loop, comprising the source followers $M_1$ and $M_2$ and the feedback resistors $R_{FB1}$ and $R_{FB2}$, may eliminate any low frequency cutoff issues and may also be operable to level shift the voltage levels at the coupling capacitors to ensure consistent bias points across the transimpedance amplifier circuit 300. Exemplary performance for such a circuit exhibits a low frequency cutoff of 20 kHz, and a high-frequency cutoff of 6.6 GHz with a sensitivity of −26.8 to −27.6 dB.

The invention is not limited to electrical signals received from a photodetector, such as that shown in the exemplary embodiment of FIG. 3. Accordingly, the transimpedance amplifier circuit 300 may be utilized to amplify any electrical signals, irrespective of the source of the signals, by communicating the electrical signals to the coupling capacitors $C_1$ and $C_2$ without the use of a photodetector.

In an embodiment of the invention, a method and system are disclosed for amplifying electrical signals received via coupling capacitors $C_1$ and $C_2$ utilizing a transimpedance amplifier (TIA) 303 having feedback paths comprising source followers $M_1$ and $M_2$ and feedback resistors $R_{FB1}$ and $R_{FB2}$. The feedback paths may be coupled prior to the coupling capacitors $C_1$ and $C_2$ at inputs of the TIA 303. Voltages may be level shifted prior to the coupling capacitors $C_1$ and $C_2$ to ensure stable bias conditions for the TIA 303. The transimpedance amplifier 303 may be integrated in a CMOS chip 130 and the source followers $M_1$ and $M_2$ may comprise CMOS transistors. The TIA 303 may receive current-mode logic or voltage signals. The electrical signals may be received from a photodetector 301, which may comprise a silicon germanium photodiode and may be differentially coupled to the transimpedance amplifier 303. The chip may comprise a CMOS photonics chip 130 where optical signals for the photodetector 301 in the CMOS photonics chip 130 may be received via one or more optical fibers 145.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A system for processing electrical signals, the system comprising:
   an amplifier circuit having coupling capacitors, a gain stage, and feedback paths comprising source follower transistors, wherein:
      said feedback paths are coupled to first terminals of said coupling capacitors;
      second terminals of said coupling capacitors are coupled to inputs of said gain stage;
      said gain stage amplifies electrical signals received via said coupling capacitors; and
      gate terminals of said source follower transistors are coupled to output terminals of said gain stage.

2. The system according to claim 1, wherein said source follower transistors are operable to level shift voltages prior to said coupling capacitors to ensure stable bias conditions for said amplifier circuit.

3. The system according to claim 1, wherein said amplifier circuit is integrated in a complementary metal-oxide semiconductor (CMOS) chip.

4. The system according to claim 3, wherein said CMOS chip comprises a CMOS photonics chip.

5. The system according to claim 4, wherein said CMOS photonics chip receives optical signals for said photodetector via one or more optical fibers.

6. The system according to claim 1, wherein said source follower transistors comprise CMOS transistors.

7. The system according to claim 1, wherein said gain stage receives current-mode logic signals.

8. The system according to claim 1, wherein said gain stage receives voltage signals.

9. The system according to claim 1, wherein said electrical signals are received from a photodetector.

10. The system according to claim 9, wherein said photodetector comprises a silicon germanium photodiode.

11. The system according to claim 9, wherein said photodetector is differentially coupled to said gain stage.

12. A method for processing optical signals, the method comprising:
   in an amplifier circuit having coupling capacitors, a gain stage, and feedback paths comprising source follower transistors, wherein said feedback paths are coupled to first terminals of said coupling capacitors, second terminals of said coupling capacitors are coupled to inputs of said gain stage, and gate terminals of said source follower transistors are coupled to output terminals of said gain stage:
      amplifying electrical signals received via said coupling capacitors utilizing said gain stage.

13. The method according to claim 12, comprising level shifting voltages prior to said coupling capacitors to ensure stable bias conditions for said amplifier circuit.

14. The method according to claim 12, wherein said source follower transistors comprise CMOS transistors.

15. The method according to claim 12, wherein said gain stage receives current-mode logic signals.

16. The method according to claim 12, wherein said gain stage receives voltage signals.

17. The method according to claim 12, wherein said amplifier circuit is integrated in a complementary metal-oxide semiconductor (CMOS) chip.

18. The method according to claim 17, wherein said CMOS chip comprises a CMOS photonics chip.

19. The method according to claim 12, comprising receiving said electrical signals from a photodetector.

20. The method according to claim 19, comprising receiving optical signals for said photodetector in said CMOS photonics chip via one or more optical fibers.

21. The method according to claim 19, wherein said photodetector comprises a silicon germanium photodiode.

22. The method according to claim 19, wherein said photodetector is differentially coupled to said gain stage.

* * * * *

UNITED STATES PATENT AND TRADEMARK OFFICE
CERTIFICATE OF CORRECTION

PATENT NO. : 10,763,807 B2
APPLICATION NO. : 16/372164
DATED : September 1, 2020
INVENTOR(S) : Brian Welch Page 1 of 1

It is certified that error appears in the above-identified patent and that said Letters Patent is hereby corrected as shown below:

On the Title Page

In item (57), in Column 2, in "Abstract", Line 1, delete "trans-impedance" and insert -- transimpedance --, therefor.

In the Specification

In Column 1, Line 18, delete "Jul. 2, 2010." and insert -- Jul. 6, 2010. --, therefor.

Signed and Sealed this
Seventeenth Day of November, 2020

Andrei Iancu
*Director of the United States Patent and Trademark Office*